United States Patent [19]
Wallace et al.

[11] Patent Number: 5,316,793
[45] Date of Patent: May 31, 1994

[54] DIRECTED EFFUSIVE BEAM ATOMIC LAYER EPITAXY SYSTEM AND METHOD

[75] Inventors: Robert M. Wallace, Dallas; Bruce E. Gnade, Rowlett, both of Tex.

[73] Assignee: Texas Instruments Incorporated, Dallas, Tex.

[21] Appl. No.: 919,685

[22] Filed: Jul. 27, 1992

[51] Int. Cl.$^5$ ............................................. C23C 16/00
[52] U.S. Cl. .............................. 427/248.1; 427/255.1; 427/255.2; 427/294; 118/50; 118/715; 118/719
[58] Field of Search .................. 427/248.1, 294, 255.1, 427/255.2; 118/715, 50, 710

[56] References Cited
U.S. PATENT DOCUMENTS

| | | | |
|---|---|---|---|
| 4,980,204 | 12/1990 | Fujii et al. | 427/248.1 |
| 4,993,358 | 2/1991 | Mahawili | 427/248.1 |
| 5,084,125 | 1/1992 | Aoi | 118/715 |
| 5,091,217 | 2/1992 | Hey et al. | 427/248.1 |
| 5,102,689 | 4/1992 | Bachman et al. | 427/248.1 |
| 5,108,792 | 4/1992 | Anderson et al. | 118/715 |
| 5,133,284 | 7/1992 | Thomas et al. | 427/248.1 |

*Primary Examiner*—Janyce Bell
*Attorney, Agent, or Firm*—Richard A. Stoltz; James C. Kesterson; Richard L. Donaldson

[57] ABSTRACT

A system and method for epitaxial growth of high purity materials on an atomic or molecular layer by layer basis wherein a substrate is placed in an evacuated chamber which is evacuated to a pressure of less than about $10^{-9}$ Torr and predetermined amounts of predetermined precursor gases are injected into the chamber from a location in the chamber closely adjacent the substrate to form the atomic or molecular layer at the surface of the substrate while maintaining the pressure at less than about $10^{-9}$ Torr in the chamber in regions thereof distant from the substrate. The precursor gases are provided from a plurality of tanks containing the precursor gases therein under predetermined pressure and predetermined ones of the tanks are opened to the chamber for predetermined time periods while maintaining the pressure in the tanks. A dose limiting structure is provided for directing predetermined amounts of the precursor gases principally at the substrate with a dose limiting directional structure.

16 Claims, 1 Drawing Sheet

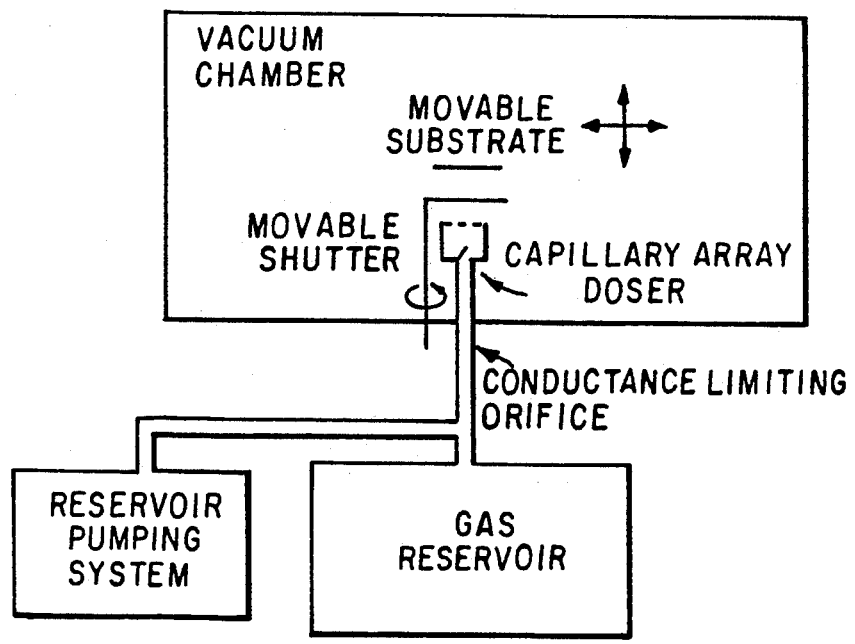

DIRECTED EFFUSIVE BEAM ATOMIC LAYER EPITAXY SYSTEM AND METHOD

BACKGROUND OF THE INVENTION

1. Field of the Invention

This invention relates to a method and system for epitaxial growth of high purity materials on an atomic or molecular layer by layer basis.

2. Brief Description of the Prior Art

Atomic layer epitaxy (ALE) has been in existence for in excess of ten years as noted by M. A. Harman in *Vacuum*, volume 42, page 61 (1991) and *Atomic Layer Epitaxy* by T. Suntola and M. Simpson, Editors, Chapman and Hall (1990) and U.S. Pat. No. 4,048,430 of T. Suntola and M. Antson. ALE has been shown to produce high quality crystalline films of a variety of materials. The ALE approach is, in actuality, a special mode of other physical and chemical deposition growth techniques, such as chemical vapor deposition (CVD) or molecular beam epitaxy (MBE). ALE is based upon chemical reactions at carefully prepared, typically heated, substrate surfaces. The constituent elements of the film are delivered to the sample sequentially as pulses of neutral molecules or atoms.

The chemical reactions in the ALE process are self-limiting in that the available bonds (reactive sites) on the surface are consumed in their entirety. This limits the growth of the film to single layers of the reactant species. Through using the surface chemistry in the process, enhanced reactivity of the precursor may be expected at lower temperatures. The choice of the molecular species is based upon known surface chemistry in order to take advantage of the self-limiting reaction and lower growth temperatures. This includes choosing a precursor molecule on the basis of the reaction and lower growth temperatures. This also includes choosing a precursor molecule on the basis of the steric interactions of an adsorbed/reactant species, which permits an accurate control of surface coverage.

Two basic variants of ALE exist. A first such variant utilizes a direct ALE process whereby elemental constituents are deposited onto the substrate and direct chemical reactions ensue between these reactants and the outermost surface atoms. A second such variant process relies upon the sequential surface exchange reactions between the substrate surface atoms and the molecules of the reactants which are chemical compounds.

Typically, the vacuum chamber used in the ALE approach is backfilled with a gas phase molecule to result in high vacuum pressures on the order of $10^{-5}$ Torr (relatively high pressure). The vacuum chamber is frequently purged with a non-reactive gas between exposures. These relatively high pressures can result in the introduction of impurities into the film due to the usual purging process.

Precision dosing techniques of single crystal surfaces with molecular species have also been understood for some time as noted by C. T. Campbell and S. M. Velone in *Journal of Vacuum Science Technology*, Vol 43, page 408 (1985) and by A. Winkler and J. T. Yates, Jr. in *Journal of Vacuum Science Technology*, Vol 46, page 2929 (1988) and have largely concentrated upon academic surface science experiments as noted by R. M. Wallace in *Backscattering and Chemical Investigation of Semiconductor Surfaces*, a Ph.D. dissertation, University of Pittsburgh (1988). The technique comprises a gas reservoir of high purity gas vapor, typically at pressures below 1 atmosphere. This reservoir is connected to the vacuum chamber used for exposing the substrate through a small conductance limiting orifice, on the order of a few microns in diameter. This permits precise control of the molecular flux into the system by manipulating the reservoir pressure. The flux of molecules is passed to an effusive capillary assembly, generally comprising an array of capillaries, and directed at the substrate.

As noted above, the purging step, which has been required by the prior art, introduces impurities into the system when operating on an atomic and/or molecular scale. It is therefore desirable to eliminate the purging step from the operation.

SUMMARY OF THE INVENTION

By using directed effusive molecular beams of the precursor gas and a suitable gas reservoir, a substrate is exposed with great precision to a gaseous precursor molecule to result in the formation of an epitaxial or amorphous single adsorbed layer (monolayer) at extremely low ambient pressures. The effusive beam is directed through the use of a suitable capillary array separated from the gas reservoir with a small conductance limiting orifice. The exposure of the substrate surface is controlled by shuttering the beam, manipulating the gas reservoir supply pressure or moving the substrate away from or out of the direct beam.

The use of precision, directed effusive molecular beams permits the exposure of the substrate surface to the precursor molecule of interest without the conventional ALE intermediate purging step, thus avoiding the introduction of impurities from the vacuum vessel walls. The local pressure in the vicinity of the substrate is on the order of $10^{-7}$ to $10^{-8}$ Torr, while the pressure in other portions of the chamber remains in the ultra-high vacuum pressure regime of $10^{-9}$ Torr and below. Purity is also maintained by using a separate gas dosing facility for each species of interest.

By controlling the gas pressure of the associated reservoir, the flux of molecules delivered through the conductance limiting orifice and thus to the substrate is controlled. By controlling the substrate-doser position, the coverage of the substrate surface by well established angular distribution calculations is controlled. Growth of the surface film is controlled by the ALE process and the use of shutters, pumps or crystal positioning. Control of shutters and substrate positioning is provided by computer control of a partial pressure monitor, such as a residual gas analyzer. Pumping valves may also be computer controlled. Precursor gas supply pressure is maintained through a pressure monitoring device and valves or mass flow controllers.

By performing exposures at extremely low pressures, purity of the films is improved over that of conventional atomic layer epitaxy. Additionally, material and dopant profiles are made to a monolayer thickness scale. Accelerated growth rates are provided because gas purging of the vacuum chamber is not required. Because of the vacuum pressures required, there is less chance of gas phase nucleation.

Smaller amounts of precursor chemicals/gases are required in comparison with the prior art, thus providing an economic advantage. Also, amounts of toxic materials for precursors, if required, are reduced and thus present less of a health risk and reduced disposal requirements.

The system and method in accordance with the present invention can be used in conjunction with conventional ultrahigh vacuum growth techniques, such as molecular beam epitaxy, to include the possibility of source species which are not easily rendered in gaseous form. Thus, through the combination of the methods, a wide number of chemical compounds can be produced in films.

BRIEF DESCRIPTION OF THE DRAWING

The FIGURE is a schematic diagram of a directed effusive beam atomic layer epitaxy system in accordance with the present invention.

DESCRIPTION OF THE PREFERRED EMBODIMENT

With reference to the FIGURE and the system set forth therein, any device that requires deposition of dielectrics and/or metals can be fabricated therein. Assuming that a semiconductor device is to be fabricated, there is provided an ultra-high vacuum chamber 1 with vacuum of from about $10^{-9}$ to about $10^{-11}$ Torr and below. An appropriate substrate 3, preferably a single crystal substrate such as, for example, silicon, a group III-V semiconductor compound such as gallium arsenide or the like, etc. is disposed within the chamber 1 and is movable in an x, y and z orientation (i.e., in three dimensions) and is also rotatable about an axis passing through the sample in standard manner, such as with a standard robotic wafer holder. The goal is to be able to place the substrate surface in line-of-sight of the doser assembly.

An appropriate gas or gases in predetermined amounts, as determined by the opening and closing of valves on a gas reservoir 5, are expelled from the gas reservoir through a conductance limiting orifice 9 having a diameter of from about 1 to about 5 microns and a capillary array doser 7, the latter preferably in the form of an orifice and directed at the substrate 3 from a location within the vacuum chamber from a location closely adjacent the substrate and into the vacuum chamber atmosphere. The doser assembly provides a means to deliver the gaseous precursor to the substrate surface in a spatially controlled manner. A doser is constructed, for example, from a cylindrical tube or in a more complicated array (shower head) of holes, as in a microcapillary array. The purpose of the orifice 9 is to provide a controlled, reproducible means to admit gaseous precursors from the precursor reservoir to the doser assembly and hence to the substrate. The size of the orifice is critical in controlling the flux of precursor molecules to an acceptable rate for reasonable growth rates to insure that the conductance is independent of reservoir pressure (i.e., molecular flow kinetics is appropriate) and maintaining the integrity of the vacuum chamber (and thus, film purity).

The pressure in the chamber will rise due to the entry of the gases thereinto, mainly in the vicinity of the substrate 3, and will then fall due to the breakdown and deposition of some of the gases onto the substrate. The pressure in the chamber 1 and particularly in the vicinity of the substrate 3 is monitored to determine when a sufficient amount of the gas in the chamber has deposited on the substrate 1. The pressure in the vicinity of the substrate is monitored, for example, indirectly through the use of a residual gas analyzer (RGA). The RGA is tuned to monitor the partial pressure of the precursor species being admitted into the doser assembly. A fraction of this flux of precursor intercepts the substrate 3 and subsequently reacts on the surface thereof. The remaining portion of precursor misses the substrate and becomes randomly scattered throughout the chamber. The RGA signal for the precursor serves as a measure of this random flux and thus, by mass conservation, serves as an indirect monitor of the local pressure near the substrate. A reservoir pumping system 11 removes the residual precursor species from the reservoir volume, excluding the source tanks at the gas reservoir 5 which are valved. The region between the orifice 9 and the doser assembly 7 is pumped by a chamber 1 pumping system. This is a small volume of gas and results in rapid removal of the gas from the vicinity of the sample. A second pumping/valve configuration can be provided in this small area between the orifice 9 and the doser assembly 7 to improve the temporal control of the flux. A shutter assembly also can serve in this capacity when placed between the doser assembly 7 and the substrate 3. The above described procedure is then repeated for the next atomic or molecular layer of the same or different material, this being repeated as many times as required to provide the final desired structure.

The gas reservoir 5 comprises a plurality of gas-containing tanks with a valve on each tank, the particular gas or gases required during each deposition step determining which of the gas containing tanks is opened. Furthermore, a known pressure is maintained in each of the gas containing tanks so that a known amount of gas is released upon the opening and closing of the valve on each of the tanks.

Assuming, for example, that a layer of doped gallium arsenide is now to be fabricated on the substrate 3, the substrate is selected to be clean, undoped crystalline gallium arsenide and the chamber 1 is evacuated to a vacuum of $10^{-10}$ Torr with a conventional pumping system (not shown). The gases required for fabrication of a doped gallium arsenide layer are provided under pressure of from about 0.1 to about 10 Torr in the gas reservoir 5 which contains plural separate tanks of appropriate gases under pressure with a controlled valve on each tank (not shown) which permits the gas to escape from the associated tank. The orifice 9 has a constant leak rate for a given precursor in this pressure regime. Typical values are $10^{12}$ to $10^{13}$ molecules/second. The number required depends upon the number of reactive sites on the surface of the substrate 3. An estimate of this is, for example, about $10^{15}$ sites Thus, a time period of 100 to 1000 seconds is required to completely consume the reactive surface sites through the chemical reaction with the precursor. The key concept is the self-limiting aspect of the ALE process. That is, one only need control the amount of the precursor gas crudely and the self-limiting surface reaction takes care of the rest of the work, by definition. Accordingly, arsine gas is expelled from one of the tanks 5 upon opening and closing for a known time period of the associated valve through a capillary array doser 7 and a conductance limiting orifice 9, which is preferably an orifice having a diameter of about 1 to 5 microns and preferably 3 microns into the evacuated chamber 1. The other precursor species (trimethyl gallium and silane dopant) are admitted in consecutive fashion using the pumping sequence described hereinabove. By admitting the precursors sequentially, one avoids undesirable gas phase reactions in the reservoir. This causes some buildup of pressure within the chamber 1, this pressure being monitored with a standard pressure measuring device (not shown) until the pressure has dropped back to a predetermined value caused by breakdown and/or deposit of material from the gaseous phase onto the substrate 3. The change in pressure is a measure of the amount of material deposited on the substrate surface. With the precursor gases containing gallium, arsenic and a dopant, doped gallium arsenide is deposited on the substrate 3.

Atomic layer epitaxy is based upon the use of precursors which are self-limiting in growth. The ideal precursors comprise species that deposit a single monolayer of the element of interest which will not react further without additional stimulation, or the presence of a second precursor species which will further react with the initial species. This technique can include more than two reactants and is ideally suited for the use of delta-doping (where a single monolayer of dopant is placed in the structure and each dopant is electrically active). A use of atomic layer epitaxy for the growth of silicon carbide (SiC) will now be described in a specific embodiment.

The silicon precursor used is $SiCl_2H_2$ and the carbon precursor is $CH_2Cl_2$. Aluminum is a p-type dopant in SiC, thus the use of $Al(CH_3)_3$ as the aluminum precursor is appropriate. A SiC substrate is then exposed to a controlled amount of $SiCl_2H_2$, which bonds to the SiC surface, loosing two hydrogen atoms in the process. Once a monolayer is deposited, the substrate surface consists of Si—$Cl_2$ species thereon. This substrate surface is no longer reactive and therefore the Si deposition stops. The next step is to remove the chlorine in order to make the surface reactive again. There are several ways to accomplish this task. For example, the ideal solution comprises exposing the surface to a controlled amount of $CH_2CL_2$, apparently liberating the surface bound chlorine to the gas phase (as HCl and $Cl_2$) and thereby depositing carbon on the surface. Other solutions include (1) exposing the substrate surface to atomic hydrogen to form HCl, (2) exciting the substrate surface with ultra-violet radiation to break the Si-Cl bond and (3) heating the substrate surface to thermally break the Si—Cl bond. After the chlorine removal, the reactive silicon surface is exposed to the carbon-bearing precursor, $CH_2Cl_2$, resulting in a monolayer of deposited carbon. Again, the chlorine is removed as described above. The aluminum dopant is added in a similar manner at an appropriate point in the process, that is, when the layer in the structure is deposited wherein the dopant is required.

It is important to note that since the deposition is taking place at relatively low temperatures, the terminated surfaces are quite stable. Even if the use of intermediate reactants to remove terminating species is required (e.g., chlorine above), the use of controlled exposures through the effusive beam apparatus described hereinabove permits the growth of complex structures which would not be possible by other techniques. This is an important feature in that it separates the subject disclosure from the standard ALE or migration enhanced epitaxy.

The substrate 3 is generally at room temperature. However, it can be heated or cooled in standard manner, as required, to stimulate growth onto the substrate.

The reservoir pumping system 11 is utilized when gases in the chamber 1 are to be changed. In this case, with the gas reservoir 5 closed, any remaining gas in the conductance limiting orifice 9 and the capillary array doser 7 is pumped into the reservoir pumping system 11. One or more of the above described procedures for forming another monatomic or molecular layer are then repeated with the same or different precursor gases, as required, to build up the device being fabricated.

The valves (not shown) which control gas flow from the tanks of the gas reservoir 5 can be automated, such as under control of a computer, or hand operated.

In order to maintain the high vacuum conditions within the vacuum chamber 1, a load lock (not shown) can be coupled to the vacuum chamber so that a processed substrate or a substrate for processing can be entered into or removed from the chamber 1 to the load lock with little reduction of the vacuum within the chamber. This reduces the time required to obtain the high vacuum conditions required.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A method of forming an atomic or molecular layer on a substrate comprising the steps of:
   (a) placing a substrate in an evacuated chamber;
   (b) evacuating said chamber to a pressure of less than about $10^{-9}$ Torr; and
   (c) injecting precursor gases into said chamber, sufficient to react with available sites on said substrate to form a layer on said substrate, into said chamber from a location in said chamber adjacent said substrate to form said atomic or molecular layer at the surface of said substrate while maintaining said pressure in said chamber in regions thereof distant from said substrate.

2. The method of claim 1, wherein step (c) comprises the steps of providing a plurality of tanks containing precursor gases therein under pressures above the pressure in said evacuated chamber and opening one or more of said tanks to said chamber for time periods while maintaining said pressures in said tanks.

3. The method of claim 1 wherein said step of injecting includes the step of directing said precursor gases principally at said substrate.

4. The method of claim 2 wherein said step of injecting includes the step of directing said precursor gases principally at said substrate.

5. The method of claim 1 further including the step of removing remaining precursor gases subsequent to said step of injecting.

6. The method of claim 2 further including the step of removing remaining precursor gases subsequent to said step of injecting.

7. The method of claim 3 further including the step of removing remaining precursor gases subsequent to said step of injecting.

8. The method of claim 4 further including the step of removing remaining precursor gases subsequent to said step of injecting.

9. The method of claim 5 further including then repeating the steps of claim 1.

10. The method of claim 6 further including then repeating the steps of claim 2.

11. The method of claim 7 further including then repeating the steps of claim 3.

12. The method of claim 8 further including then repeating the steps of claim 4.

13. A system for forming an atomic or molecular layer on a substrate comprising:

(a) an evacuated chamber;

(b) an evacuating device coupled to said chamber for evacuating said chamber to a pressure of less than about $10^{-9}$ Torr;

(c) a reservoir for injecting one or more predetermined precursor gases into said chamber from a location in said chamber closely adjacent said substrate to form said atomic or molecular layer at the surface of said substrate while maintaining said pressure in said chamber in regions thereof distant from said substrate;

(d) an orifice coupled to said reservoir for limiting conductance of gases from said reservoir; and (e) a capillary doser coupled to said orifice and extending into said chamber adjacent said substrate for directing said precursor gases principally at said substrate.

14. The system of claim 13, wherein said reservoir comprises a plurality of tanks containing precursor gases therein under pressures above the pressure in said evacuated chamber and a controlled valve on each of said tanks, each said controlled valve opening an associated one of said tanks to said chamber for a time period sufficient to form said atomic layer while maintaining said pressures in said tanks.

15. The system of claim 13 further including means to remove remaining precursor gases from said orifice and said doser.

16. The system of claim 14 further including means to remove remaining precursor gases from said orifice and said dose.

* * * * *